United States Patent
Cranford, Jr. et al.

(10) Patent No.: US 7,340,660 B2
(45) Date of Patent: Mar. 4, 2008

(54) METHOD AND SYSTEM FOR USING STATISTICAL SIGNATURES FOR TESTING HIGH-SPEED CIRCUITS

(75) Inventors: Hayden C. Cranford, Jr., Cary, NC (US); Vernon R. Norman, Cary, NC (US); Martin L. Schmatz, Rucschlikon (CH)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 10/680,679

(22) Filed: Oct. 7, 2003

(65) Prior Publication Data

US 2005/0076279 A1  Apr. 7, 2005

(51) Int. Cl.
*G01R 31/3193* (2006.01)
*G01R 31/316* (2006.01)

(52) U.S. Cl. .......................................... 714/736; 714/45
(58) Field of Classification Search ................ 714/736, 714/55, 45, 30, 25; 375/221, 373; 365/201, 365/233
See application file for complete search history.

(56) References Cited

U.S. PATENT DOCUMENTS

| | | | |
|---|---|---|---|
| 3,789,205 A | 1/1974 | James | |
| 3,916,306 A | 10/1975 | Patti | |
| 4,204,633 A | 5/1980 | Goel | |
| 4,241,307 A | 12/1980 | Hong | |
| 4,801,870 A | 1/1989 | Eichelberger et al. | |
| 4,870,425 A * | 9/1989 | Gunny | 342/455 |
| 5,012,471 A | 4/1991 | Powell et al. | |
| 5,019,899 A * | 5/1991 | Boles et al. | 725/22 |
| 5,212,601 A * | 5/1993 | Wilson | 360/51 |
| 5,301,156 A * | 4/1994 | Talley | 365/201 |
| 5,329,559 A * | 7/1994 | Wong et al. | 375/373 |
| 6,201,829 B1 * | 3/2001 | Schneider | 375/221 |
| 6,396,768 B2 * | 5/2002 | Ooishi | 365/233 |

* cited by examiner

*Primary Examiner*—Cynthia Britt
*Assistant Examiner*—Dipakkumar Gandhi
(74) *Attorney, Agent, or Firm*—Sawyer Law Group LLP

(57) ABSTRACT

A method and system for testing a high-speed circuit is disclosed. The method and system include obtaining a high-speed statistical signature of the high-speed circuit using a conventional tester. The method and system further include comparing the high-speed statistical signature of the high-speed circuit to an expected signature. Consequently, it can be determined whether the high-speed circuit functions within the desired parameters.

14 Claims, 6 Drawing Sheets

420

430

METHOD AND SYSTEM FOR USING STATISTICAL SIGNATURES FOR TESTING HIGH-SPEED CIRCUITS

FIELD OF THE INVENTION

The present invention relates to the testing of circuitry, and more particularly to a method and system for utilizing statistical signatures for testing high-speed circuits, particularly high-speed phase and clock recovery circuits.

BACKGROUND OF THE INVENTION

Currently, high-speed circuitry capable of utilizing signals having frequencies of greater than or equal to one GHz is of increasing interest. After manufacturing of the high-speed circuitry is completed, it is highly desirable to test the circuitry to ensure that it functions properly. For example, high-speed mixed signal phase and clock recovery circuits, such as used in serializer/deserializer (SERDES) circuits, often run at several GHz. SERDES circuitry use phase and clock recovery circuits, such as a phase locked loop, to recover the clock from a high-speed serial signal input to the SERDES. Using the recovered clock as well as the data from the serial signal, a serializing/deserializing block of the SERDES can convert the serial signal to a parallel signal. The high-speed mixed signal phase and clock recovery circuits, as well as the remainder of the SERDES, are tested prior to delivery to a customer to ensure that the circuitry operates substantially as desired. Without such testing, the products delivered to the customer could contain errors, causing an additional expenditure of resource on the part of both the customer and the manufacturer of the high-speed circuits.

A conventional tester could be used to test high-speed signals such as high-speed mixed signal phase and clock recovery circuits. When operated in a conventional manner, the conventional tester would input a signal to the high-speed mixed signal phase and clock recovery circuit under test. The signal could have a particular frequency as well as a delay corresponding to a phase change. The output of the high-speed mixed signal phase and clock recovery circuit under test could then be observed to determine whether the high-speed mixed signal phase and clock recovery circuit functions as desired.

Although conventional testers could be used to test the high-speed circuitry, one of ordinary skill in the art will readily recognize that conventional testers do not run at frequencies greater than one GHz and may not set the absolute delay between signals with a high degree of accuracy. As such, the signal provided by the conventional tester is significantly lower than the frequencies at which the high-speed circuitry can operate. Consequently, conventional testers operated in a conventional manner are unable to verify that the high frequency operation of the high-speed mixed signal phase and clock recovery circuits mentioned above is without functional errors.

Other conventional methods can test the high frequency operation of the high-speed mixed signal phase and clock recovery circuit. For example, a specialized tester capable of outputting signals of greater than one GHz with an accurate delay could be provided. However, the cost of such a tester would be significant.

FIG. 1 depicts the conventional high-speed circuit 10 being tested using a conventional tester 20. This conventional method 10 for testing the operation of high-speed mixed signal phase and clock recovery circuits employs specialized boundary scan latches. The conventional high-speed circuit 10 thus includes boundary scan latches 12, switching circuitry 14, phase and clock recovery circuitry 16. Thus, the conventional high-speed circuit 10 shown could be part of SERDES circuitry. In such a case, the conventional high-speed circuit 10 could be coupled to a serializing/deserializing block (not shown). The switching circuitry 14 allows the boundary scan latches 12 to be switched between test and normal operation modes. During testing, the boundary scan latches 14 of the high-speed mixed signal phase and clock recovery circuit 10 are switched to a test mode. In test mode, the boundary scan latches 12 can be used in conjunction with the conventional tester 20 to examine the high frequency behavior of the high-speed circuitry 10.

Although the conventional high-speed circuit 10 can be tested using the conventional tester 20, one of ordinary skill in the art will readily recognize that the specialized boundary scan latches 12 would also require the use of special topologies in the conventional high-speed circuit 10. Furthermore, the switching circuits 14 that permit the boundary scan latches 12 to switch between the test and normal operation modes consume additional power. The switching circuits 14 may also result in a lower operating frequency of the conventional high-speed circuitry 10 due to the additional capacitive load on the high-speed phase and clock recovery circuitry 16. The additional power consumption and lower operating frequency are both undesirable in high-speed circuits.

Accordingly, what is needed is a system and method for testing of high-speed circuitry such as high-speed mixed signal phase and clock recovery circuits. The present invention addresses such a need.

SUMMARY OF THE INVENTION

The present invention provides a method and system for testing a high-speed circuit. The method and system comprise obtaining a high-speed statistical signature of the high-speed circuit using a conventional tester. The method and system further include comparing the high-speed statistical signature of the high-speed circuit to an expected signature. Consequently, it can be determined whether the high-speed circuit functions within the desired parameters.

According to the system and method disclosed herein, the present invention provides a method and system for adequately testing the behavior of high-speed circuits using conventional testing equipment.

DETAILED DESCRIPTION OF THE INVENTION

The present invention relates to an improvement in testing of high-speed circuitry. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for testing a high-speed circuit. The method and system comprise obtaining a high-speed statistical signature of the high-speed circuit using a conventional tester. The method and system further include comparing the high-speed statistical signature of the high-speed circuit to an expected signature. Consequently, it can be determined whether the high-speed circuit functions within the desired parameters.

The present invention will be described in terms of a particular high-speed circuits and a method having particular steps. However, one of ordinary skill in the art will readily recognize that this method and system will operate effectively for other high-speed circuits and other methods having different and/or additional steps.

Figure 1:
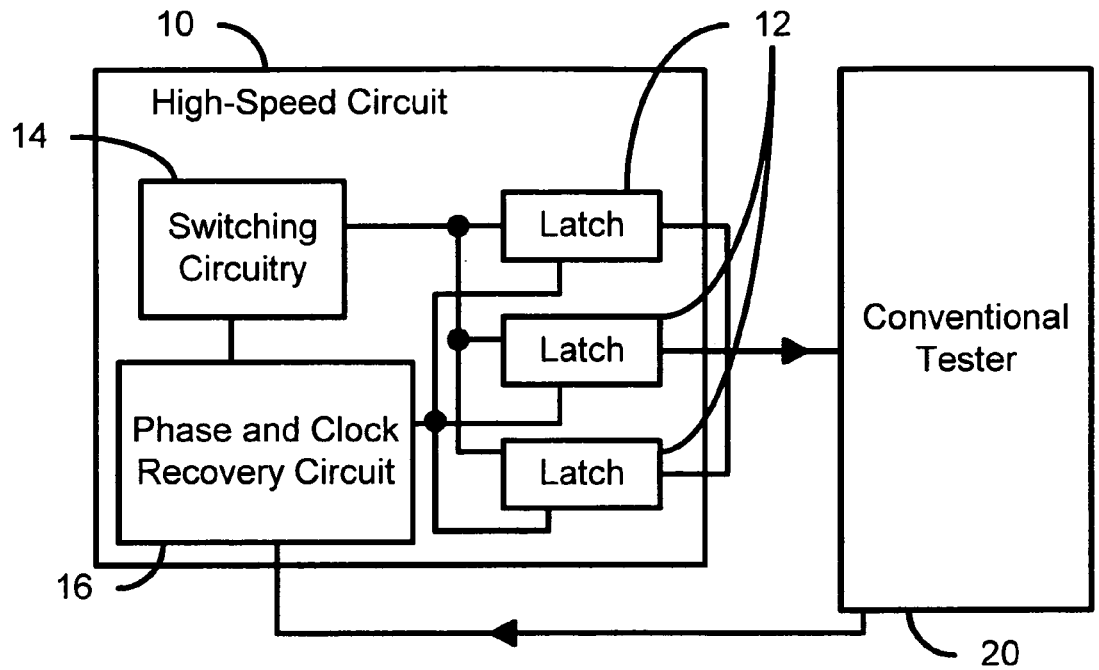
FIG. 1 is a diagram of a conventional system for testing conventional high-speed circuitry using a conventional tester.
Figure 2:
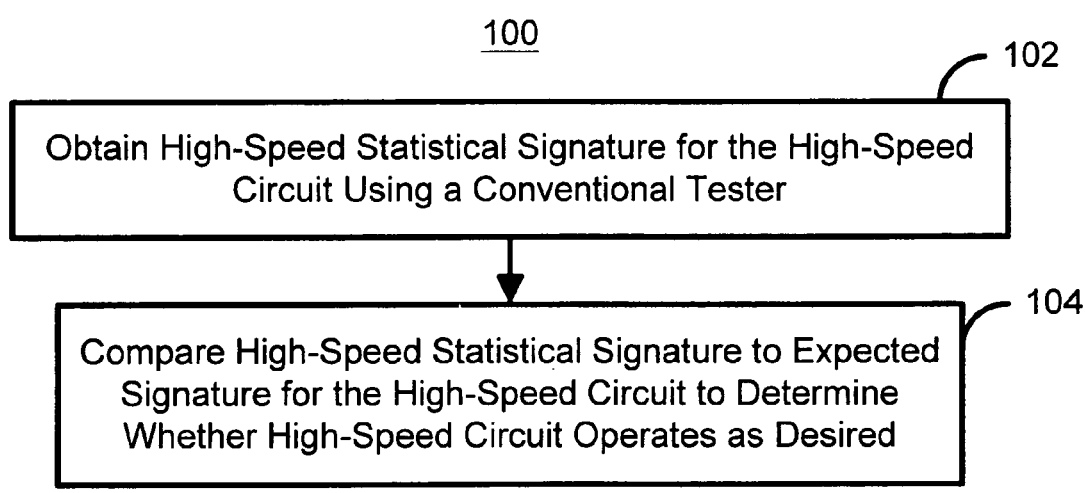
FIG. 2 is a high-level flow chart depicting one embodiment of a method in accordance with the present invention for testing high-speed circuitry using a conventional tester.

To more particularly illustrate the method and system in accordance with the present invention, refer now to FIG. 2, depicting a high-level flow chart of one embodiment of a method 100 in accordance with the present invention for testing high-speed circuitry using a conventional tester, such as the tester 20 depicted in FIG. 1. In a preferred embodiment, the method 100 is performed for a high-speed mixed signal phase and clock recovery circuit, for example in a high-speed SERDES circuit.

Referring back to FIG. 2, a high-speed statistical signature for the high-speed behavior of the high-speed circuit under test is obtained using a conventional tester, via step 102. The high-speed statistical signature corresponds to the output of the high-speed circuit under test. The high-speed statistical signature also describes the high-speed function of the high-speed circuit under test despite the use of a conventional tester. In a preferred embodiment, the high-speed statistical signature can be obtained by oversampling the output of the high-speed circuit under test. In certain embodiments, boundary scan latches or a parallel bus may be (over)sampled at a rate corresponding to a high-speed signal. For example, a conventional tester can typically output a signal having a frequency of up to one GHz. In the case of a 2 GHz circuit, a one GHz signal appears as a half-speed signal. Oversampling the latches can provide the data used in obtaining the high-speed statistical signature, which aids in verifying that the output of the high-speed circuit is substantially correct at higher speeds.

Step 102 is also preferably performed by repeating tests using a conventional tester a sufficient number of times to have a desired sample size. Even if the signal input is the same, the output of the high-speed circuit might be slightly different on each repetition of the test. This difference may be due to factors such as jitter. The use of a high-speed statistical signature can generally account for slight variations in the output not due to errors in the high-speed circuit.

In a preferred embodiment, the method 100 is used to test high-speed phase and clock recovery circuitry. In such an embodiment, step 102 is performed by providing a signal from the conventional tester and utilizing a delay that corresponds to a phase. Using the delay the phase of the signal can be changed. The output of the high-speed phase and clock recovery circuitry can be sampled to obtain the high-speed statistical signature. Thus, during a single run, the delay may be swept and data sampled. Thus, a single run would test several phases. The sweep would then be repeated multiple times. Alternatively, the delay could be fixed and the data sampled multiple times. A single run would thus test a single phase. Step 102 would then include changing the delay and repeating the sampling at each delay. In either embodiment, sufficient data to build a statistical signature is obtained.

The high-speed statistical signature is for the high-speed circuit is compared to an expected signature to determine whether the high-speed circuit functions correctly, via step 104. In a preferred embodiment, the high-speed statistical signature is subtracted from the expected signature, or vice versa. Larger differences, which may correspond to errors in the high-speed circuitry, are thus highlighted. For example, differences having a magnitude greater than a particular set of thresholds indicate that one or more portions of the high-speed circuit do not function as desired. In an alternate embodiment, another method of comparison can be used.

Thus, using the method 100, the high-speed circuit can be tested and the high-speed behavior checked with a high degree of certainty. The high-speed statistical signature obtained in step 102 accounts for minor variations, such as jitter. Furthermore, the behavior of the high-speed circuit need not exactly match the expected signature. Instead, as long as the high-speed statistical signature is within certain parameters, such as being different from the expected signature by less than a particular threshold, the high-speed circuit is considered to pass the test. Moreover, the high-speed behavior of the high-speed circuit can be checked using a conventional tester without expending additional resources on a specialized tester or specialized circuit topologies and without adversely affecting the performance of the high-speed circuit by the addition of specialized switching circuitry.

Figure 3A:
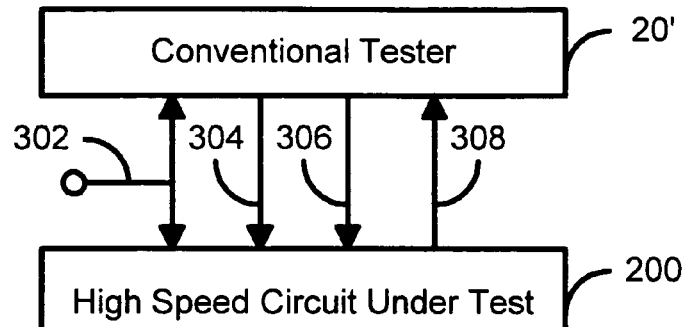
FIG. 3A is a block diagram depicting one embodiment of a system in accordance with the present invention for testing high-speed circuitry having pattern generation capabilities using a conventional tester.

FIG. 3A is a block diagram depicting one embodiment of a high-speed circuit 200 in accordance with the present invention that can be tested using a conventional tester 20'. Also depicted is a conventional tester 20' that typically includes a computer system (not explicitly shown) that may be used in testing. Also depicted are the common frequency line 302, data input line 304, phase input line 306, and readout line 308. The common reference frequency is provided to both the conventional tester 20' and the high-speed circuit under test 200 via line 302. The conventional tester 20' provides the data and phase to the high-speed circuit under test via lines 304 and 306, respectively. The conventional tester 20' reads data from the line 308. In a preferred embodiment, line 306 couples the conventional tester 20' with latches or a low speed parallel bus from which the output of the high-speed phase and clock recovery circuit is sampled for testing.

Figure 3B:
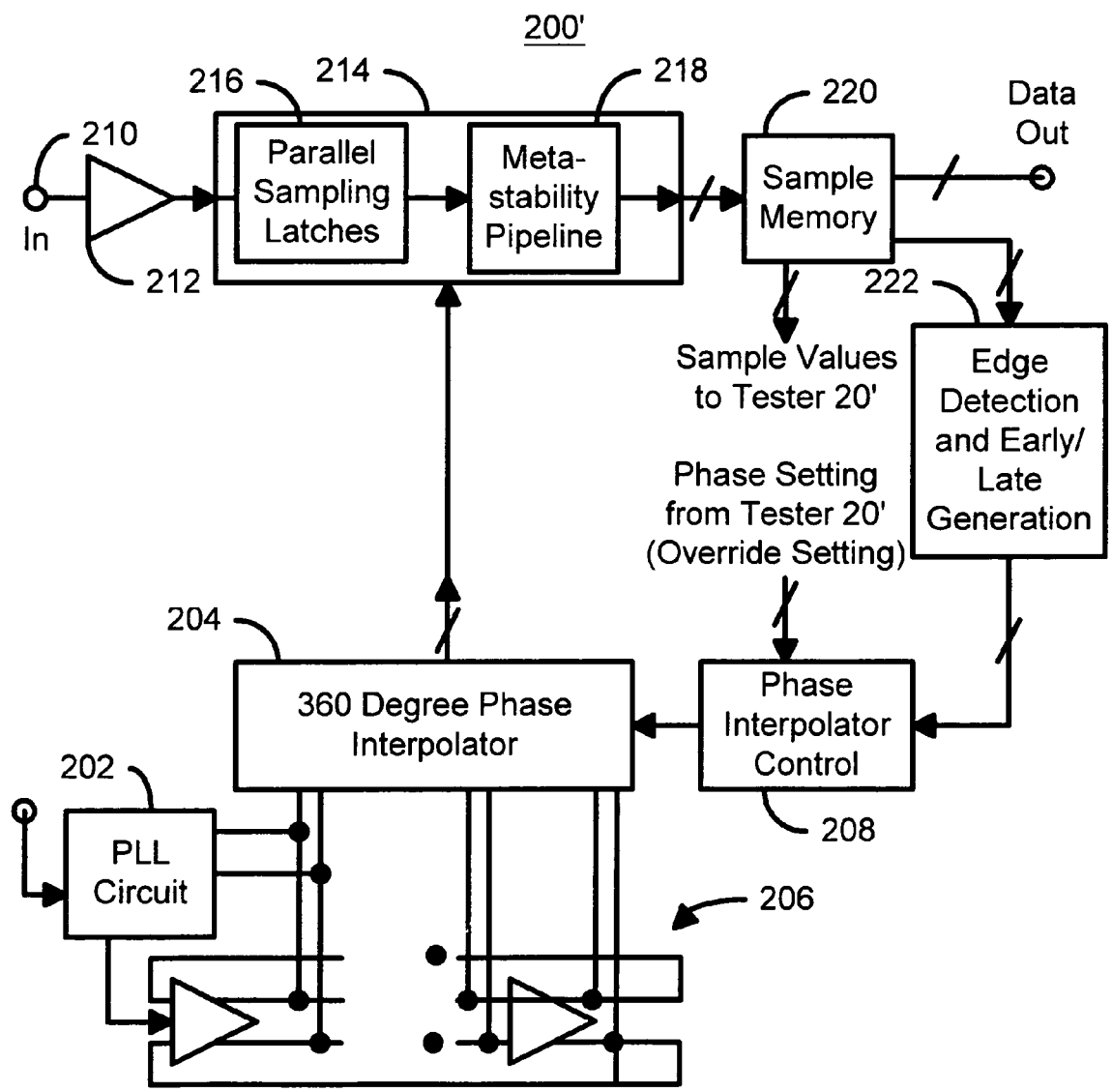
FIG. 3B is a more detailed block diagram depicting one embodiment of a system in accordance with the present invention for testing high-speed circuitry having pattern generation capabilities using a conventional tester.

FIG. 3B is a more detailed block diagram depicting one embodiment of a high-speed circuit 200' in accordance with the present invention that can be tested using a conventional tester. The high-speed circuit 200' is preferably the circuit 200 being tested in FIG. 3A. Referring back to FIG. 3B, the high-speed circuit 200' includes a phase lock loop (PLL) circuit 202, a three hundred and sixty degree phase interpolator 204, a main oscillator 206, a phase interpolator control 208, an input 210 coupled to preamplifier 212, a digitizing block 214, sample memory 220, and edge detection and early/gate generation circuit 222. The PLL circuit 202 receives a reference frequency, for example from line 302 depicted in FIG. 3A. The input 210 receives and input signal, for example from the line 304 depicted in FIG. 3A. Thus, a test pattern, which is preferably a 010101 . . . pattern, can be provided to the high-speed circuit 200'. The phase interpolator control 208 receives phase settings from the conventional tester 20', for example via line 306. The phase settings can thus be overridden (which indicates that the clock-data-recovery loop is not closed). The edge detection and early/late detection generation circuit 222 provides early/late signals, which can close the clock-data-recovery loop to the phase interpolator control 208. The phase interpolator 204 provides the shifted phases to the digitizing block 214, which includes parallel sampling latches 216 and a meta-stability pipeline 216. The values are sampled from the sample memory 220 and output to the tester, for example through line 308. The data in the sample memory is also output via the data out terminal and, for example, provided to a serializing block.

Figure 3C:
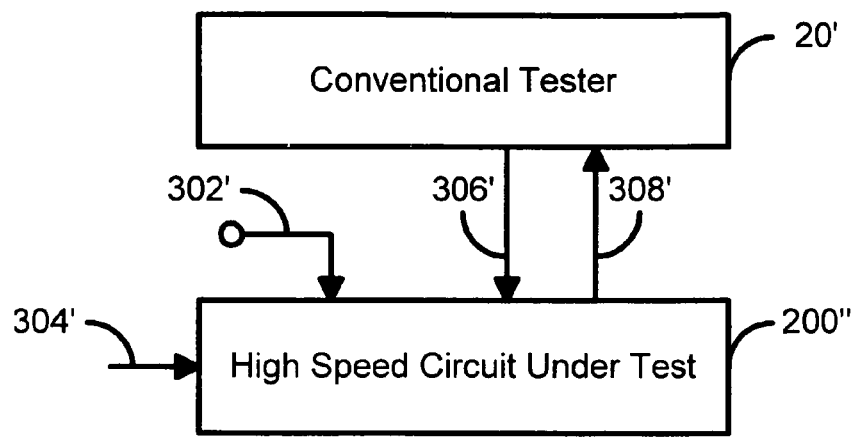
FIG. 3C is a block diagram depicting one embodiment of a system in accordance with the present invention for testing high-speed circuitry having pattern generation capabilities using a conventional tester.

FIG. 3C is a block diagram depicting one embodiment of a system in accordance with the present invention for testing high-speed circuitry 200'' having pattern generation capabilities using a conventional tester. The system 200' and the components 300 and 20' shown, are analogous to those depicted in FIG. 3A. Consequently, elements have an analogous function are labeled similarly in FIG. 3C. For example, the data input line 304' corresponds to the data input line 304. However, instead of using a common reference frequency, a reference frequency is provided only to the high-speed circuit under test because no common frequency is required.

Figure 3D:
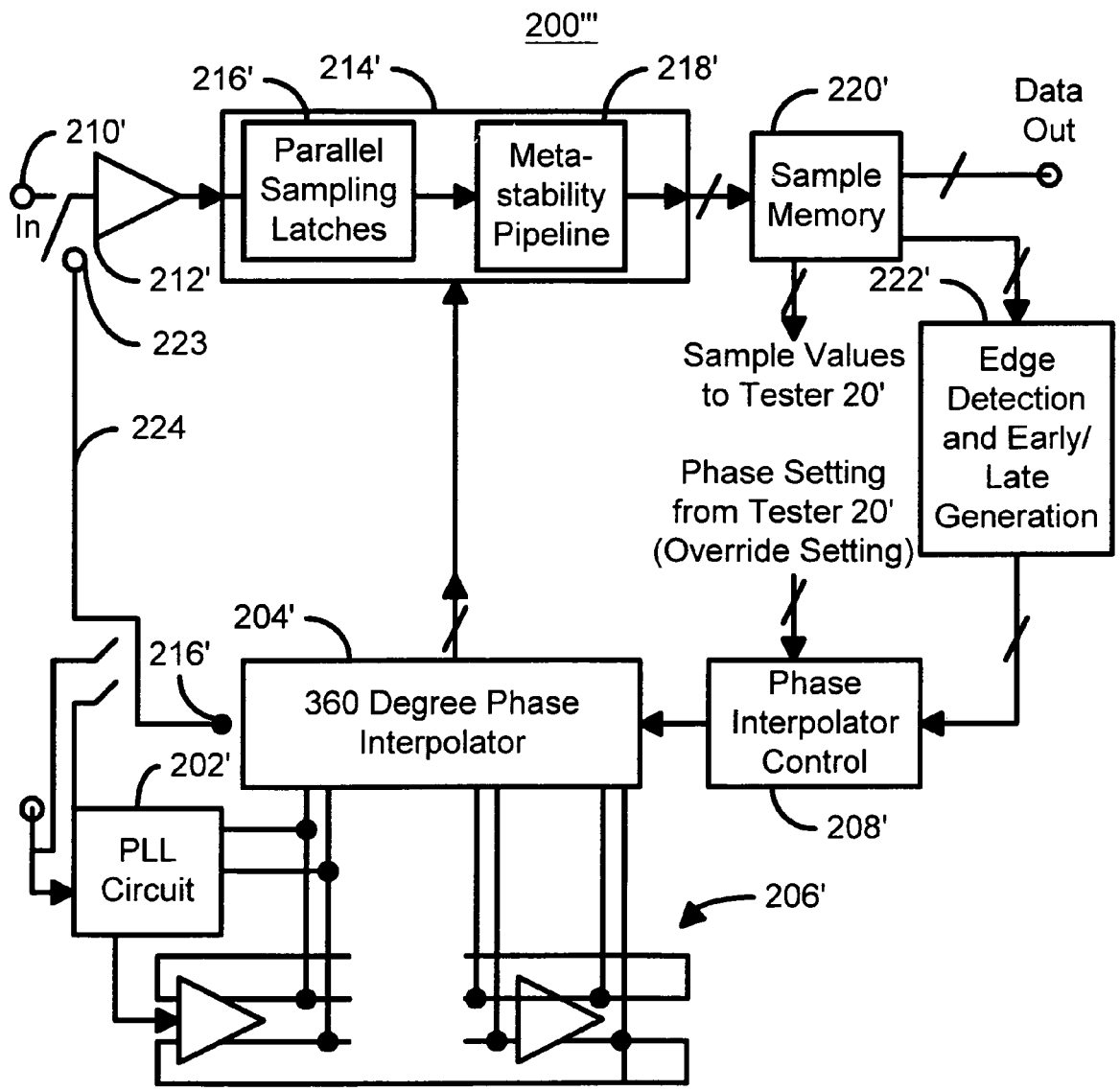
FIG. 3D is a more detailed block diagram depicting one embodiment of a system in accordance with the present invention for testing high-speed circuitry having pattern generation capabilities using a conventional tester.

FIG. 3D is a more detailed block diagram depicting one embodiment of a system in accordance with the present invention for testing high-speed circuitry 200''' having pattern generation capabilities using a conventional tester. The high-speed circuit 200''' is preferably the circuit 200'' being tested in FIG. 3C. Referring back to FIG. 3D, the high-speed circuit 200''' is analogous to the high-speed circuit 200' depicted in FIG. 3B. Consequently, analogous components are labeled similarly. For example, the high-speed circuit 200''' includes a PLL circuit 202'. The test data, which could be generated internally, can be obtained using the phase tap 226 from the PLL frequencies and an on-chip data generator (not shown). The data is provided to the input 210' using the line 224, which is selected using the switch 223 or other similar device. Alternatively, the internally generated pattern could be provided to the input after the preamplifier 212' or directly to the sampling latches 216'. The remainder of the high-speed circuit 200''' functions in an analogous manner to the high-speed circuit 200' depicted in FIG. 3B.

Figure 4:
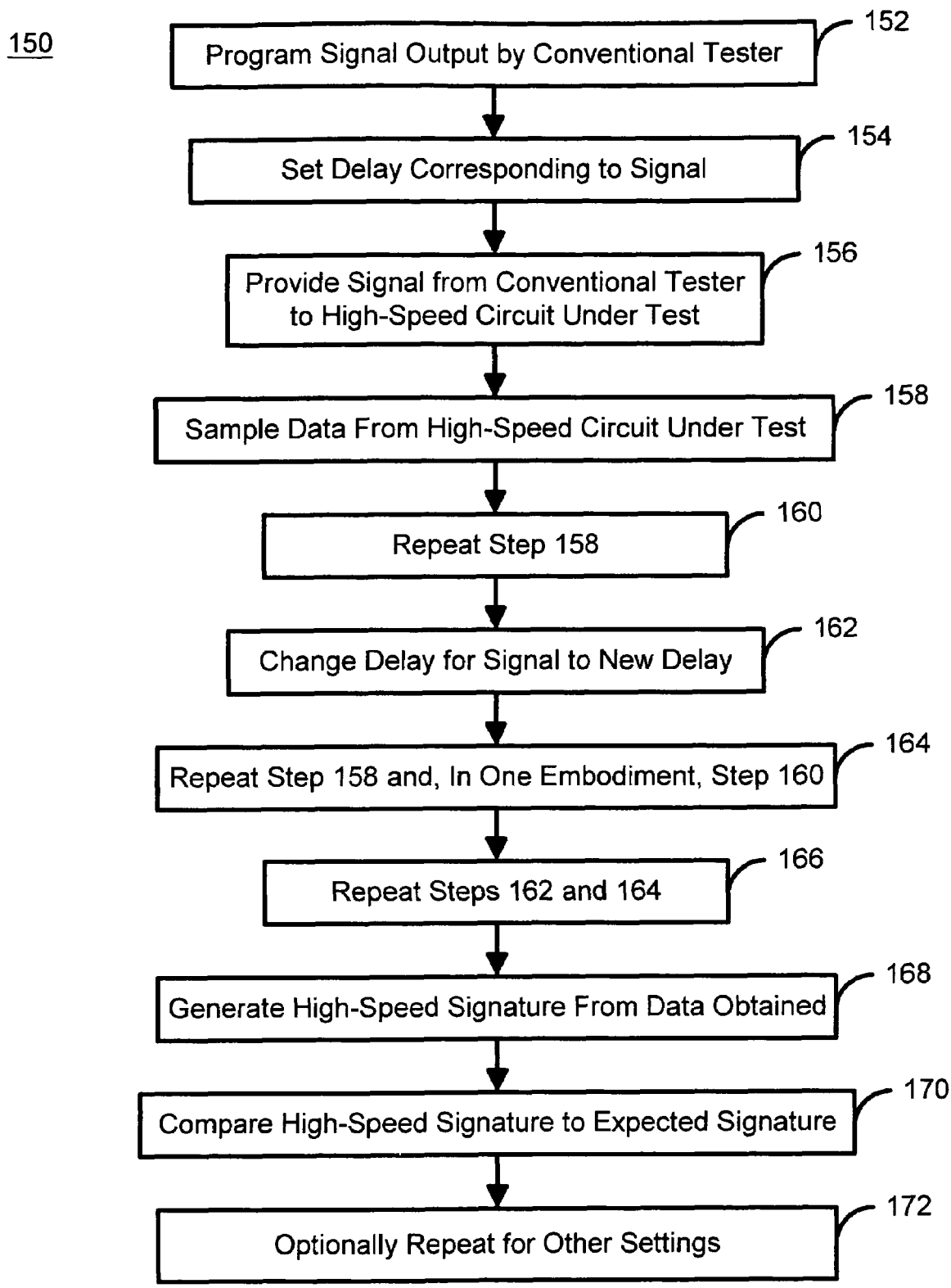
FIG. 4 is a more-detailed flow chart depicting one embodiment of a method in accordance with the present invention for testing high-speed circuitry using a conventional tester.
Figure 5:
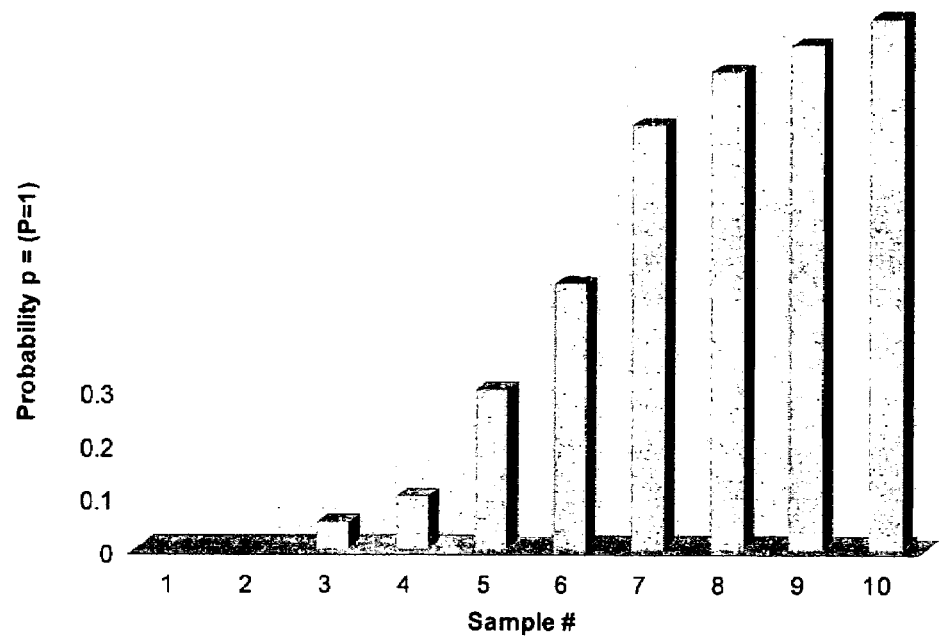
FIG. 5 is a graph depicting an example of the probability that the receiving sampler generates a "one" output at the appropriate location.

FIG. 4 is a more-detailed flow chart depicting one embodiment of a method 150 in accordance with the present invention for testing high-speed circuitry, using a conventional tester, such as the tester 20'. The method 150 is preferably used for a high-speed phase and clock recovery circuit. Consequently, the method 150 is described in conjunction with the high-speed circuit 200 depicted in FIG. 3.

The conventional tester 20' is programmed to output a signal, via step 152. The signal is a pattern of zeroes and ones and may have a particular frequency. A delay corresponding to a phase of the signal is set, via step 154. The delay may be set by programming the conventional tester 20'. In another embodiment, if the circuit 200 includes the functionality, the internal data recovery phase can be set to a first value. The data is then provided from the tester 20' to the high-speed phase and clock recovery circuit 200 using the inputs 210, via step 156. The output of the high-speed phase and clock recovery circuit 200 is sampled to obtain data for the high-speed statistical signature, via step 158. In one embodiment, step 158 includes oversampling latches in the sample memory 220 using boundary scan techniques. In another embodiment, step 158 could include sampling a parallel bus that outputs data. For example, step 158 could sample a parallel bus connects the high-speed phase and clock recovery circuit 200' to a serializing/deserializing block (not shown). Thus, data for the high-speed statistical signature at a particular delay, or phase, is obtained. The sampling of data is repeated a particular number of times in order to have sufficient data for statistics which accurately represent the behavior of the high-speed phase and clock recovery circuit 200, via step 160. The delay, and therefore the phase, is changed via step 162. Steps 156 (providing the signal having the new delay to the high-speed circuit under test) through step 160 (repeating the sampling) are repeated, via step 164. Steps 162 and 164 are repeated, via step 166. Consequently, sufficient data to describe the behavior of the high-speed phase and clock recovery circuit at multiple delays (phases) is obtained. Note that although described in order, step 162-166 could be performed prior to step 160. In such an embodiment, the tester 20' might sweep the delay, sampling data at various delays in a single run in steps 156, 158, 162, 164 and 166. Step 160 would then repeat the sweep of the delay and sampling a particular number of times. Thus, sufficient data to provide the high-speed statistical signature is obtained.

The high-speed statistical signature is generated from the data, via step 168. The high-speed statistical signature is then compared against an expected signature, via step 170. It may also be determined in step 170 whether the high-speed phase and clock recovery circuit 200 passes or fails the test being performed. In a preferred embodiment, step 170 is performed by subtracting the high-speed statistical signature from the expected signature, or vice versa. As a result, differences between the high-speed statistical signature and the expected signature become clearer. Also in a preferred embodiment, the determination of whether the high-speed phase and clock recovery circuit 200 passes or fails the test will be based on whether the differences between the high-speed statistical signature and the expected signature are within certain thresholds. The threshold(s) could be set to zero. This would require that the statistical signature exactly match the expected signature. However, the thresholds are preferably nonzero. For example, the high-speed phase and clock recovery circuit 200 might pass the test as long as the differences between the high-speed statistical signature and the expected signature are either less than particular thresholds or less than or equal to particular thresholds. Consequently, as long as the high-speed phase and clock recovery circuit 200 functions within certain desired parameters, it will be considered to pass the tests being performed. Otherwise, the high-speed phase and clock recovery circuit 200 will be considered to fail and may be discarded.

The testing performed in steps 152-170 are performed for other settings of the high-speed phase and clock recovery circuit 200 and/or other signals provided by the tester 20', via step 172. Thus, the behavior of the high-speed phase and clock recovery circuit 200 can be tested at various settings of the device.

Thus, using the method 150, the high-speed mixed phase and clock recovery circuit 200 can be tested and the high-speed behavior checked with a high degree of certainty. The high-speed statistical signature obtained in steps 152-170 accounts for minor variations. Furthermore, the behavior of the high-speed mixed phase and clock recovery circuit 200 need not exactly match the expected signature. Moreover, the high-speed behavior of the high-speed mixed phase and clock recovery circuit 200 can be checked using a conventional tester without expending additional resources on a specialized tester or specialized circuit topologies and without adversely affecting the performance of the high-speed circuit by the addition of specialized switching circuitry.

To further describe the methods 100 and 150, as well as the system 200, the data obtained by sampling the high-speed mixed phase and clock recovery circuit 200 is described. FIGS. 5, 6, 7, and 8 depict graphs of data and statistical signatures that exemplify the operation of embodiments of the method and system in accordance with the present invention. Consequently, the graphs of FIGS. 5, 6, 7, and 8, are described in the context of the method 150 and system 200 depicted in FIGS. 3 and 4. The graphs shown in FIGS. 5-8 also depict data and high-speed statistical signatures for sampling multiple locations. However, one of ordinary skill in the art will readily recognize that a single sample at a single location could be the source of a high-speed statistical signature.

Referring to FIGS. 3-8, FIG. 5 is a graph 400 depicting an example of the probability that the receiving sampler generates a "one" output at the appropriate location. The graph 400 could be considered the resultant of step 158 of the method 150, sampling the data from the high-speed circuit 200 under test. Each sampler corresponds to one of the latches (not shown) in the sample memory 220 or 220'. The "one" should occur at position six. Consequently, the probability should be close to one at position six, but lower at remaining positions. However, due to jitter, the probability of reading a zero or one changes of the positions depicted in FIG. 5.

Figure 6:
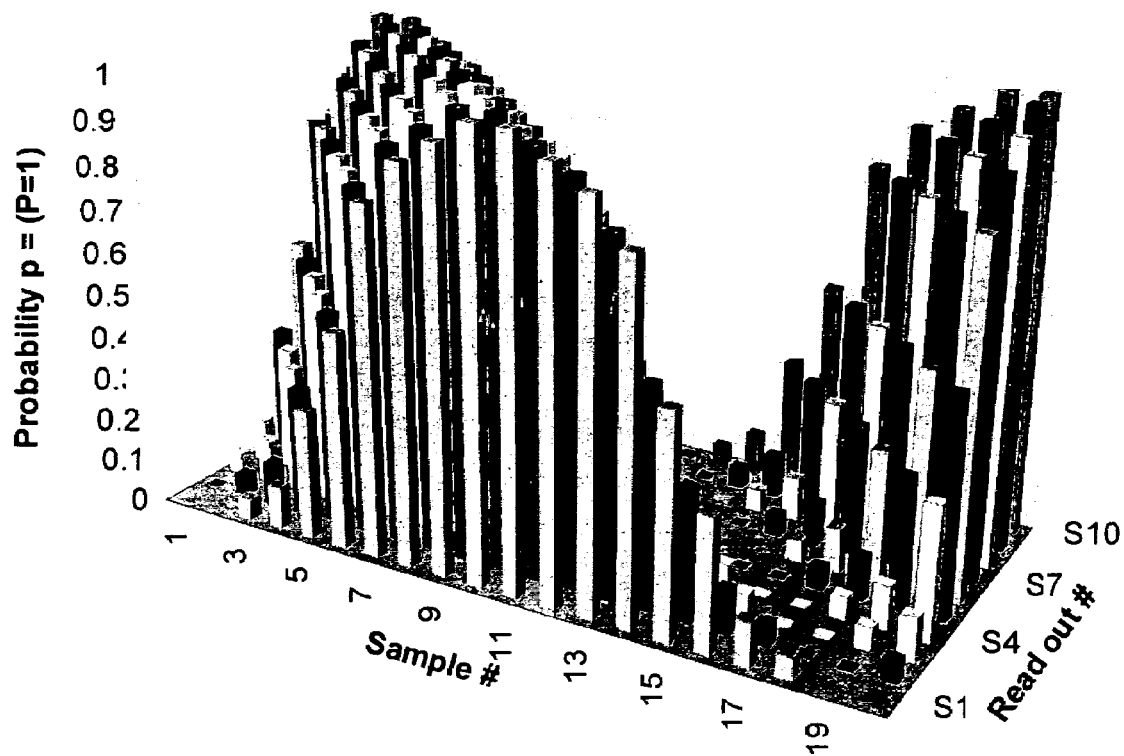
FIG. 6 is a graph depicting an example of a high-speed statistical signature for the probability that the receiving sampler generates a "one" output at the appropriate location when a phase shift is applied.

FIG. 6 is a graph 410 depicting an example of a high-speed statistical signature for the probability that the receiving sampler generates a "one" output at the appropriate location when a phase shift is applied. The graph 410 could be generated in step 168 of the method 150. The graph 410 thus depicts the phase shift in the read out number axis. As can be seen, the phase shift can be seen in the change in position of the peak in probability versus read out number.

Figure 7:
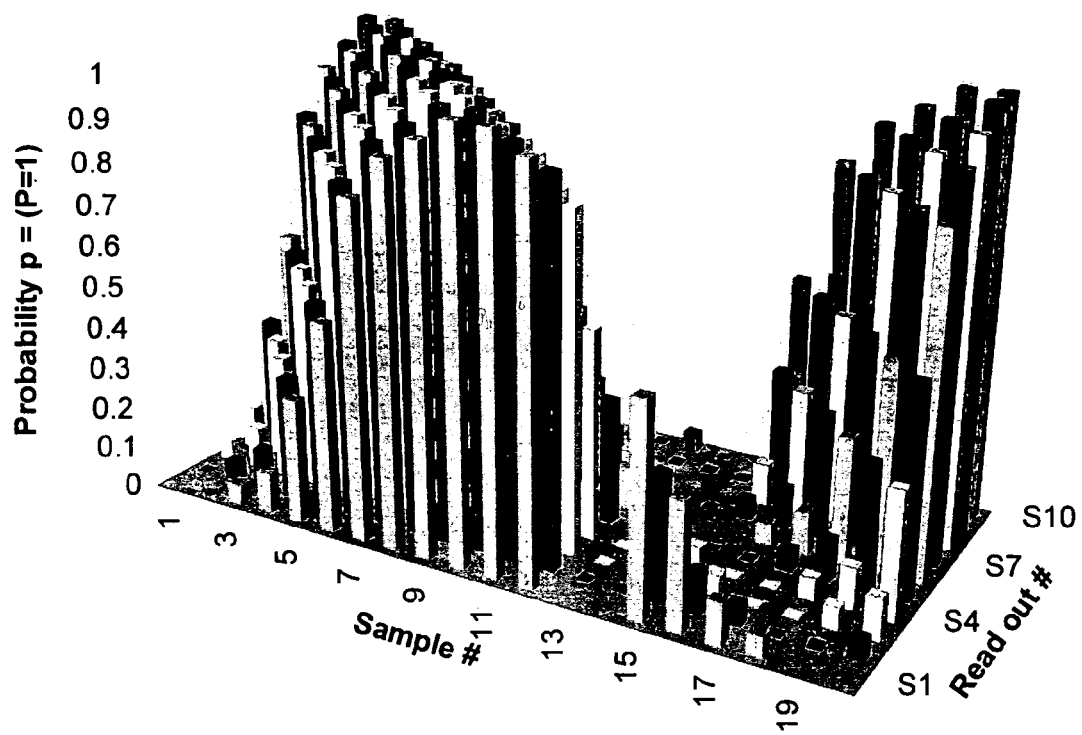
FIG. 7 is a graph depicting an example of a high-speed statistical signature for the probability that the receiving sampler generates a "one" output at the appropriate location when a phase shift is applied and when the high-speed phase and clock recovery circuit includes errors.

FIG. 7 is a graph 420 depicting an example of a high-speed statistical signature for the probability that the receiving sampler generates a "one" output at the appropriate location when a phase shift is applied and when the high-speed phase and clock recovery circuit includes errors. The graph 420 could be generated in step 168 of the method 150. The graph 420 thus depicts the phase shift in the read out number axis. As can be seen, the phase shift can be seen in the change in position of the peak in probability versus read out number. Furthermore, the graph 420 indicates an error at samples thirteen and fourteen. Thus, these sample numbers have a zero output regardless of the phase of the signal provided.

Figure 8:
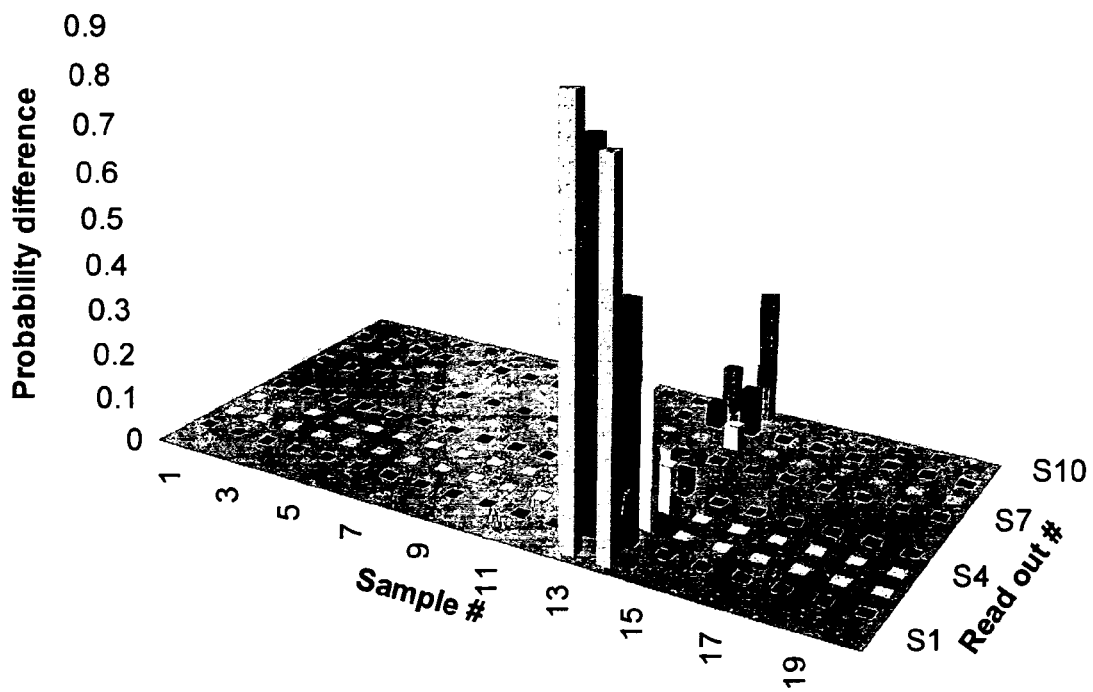
FIG. 8 is a graph depicting an example of a comparison of an expected signature and the high-speed statistical signature for the probability that the receiving sampler generates a "one" output at the appropriate location when a phase shift is applied and when the high-speed phase and clock recovery circuit includes errors.

FIG. 8 is a graph 430 depicting an example of a comparison of an expected signature and the high-speed statistical signature for the probability that the receiving sampler generates a "one" output at the appropriate location when a phase shift is applied and when the high-speed phase and clock recovery circuit includes errors. In particular, the graph 430 depicts the resultant of the graph 420 subtracted from an expected signature. Thus, the graph 430 could be generated in step 170 of FIG. 4. Because of the subtraction described above, the errors at samples thirteen and fourteen are clearly indicated. The remaining samples have differences that are nearly zero for all phases. However, samples thirteen and fourteen have large differences between the high-speed statistical signature and the expected signature. Consequently, an evaluator can relatively easily determine the locations of the errors.

Thus, using the method and system in accordance with the present invention, a high-speed mixed phase and clock recovery circuit can be tested and the high-speed behavior checked with a high degree of certainty. The high-speed statistical signature accounts for minor variations while accurately describing the high-speed behavior of the high-speed circuit under test. Furthermore, the behavior of the high-speed mixed phase and clock recovery circuit need not exactly match the expected signature. Moreover, the high-speed behavior of the high-speed mixed phase and clock recovery circuit can be checked using a conventional tester without expending additional resources on a specialized tester or specialized circuit topologies and without adversely affecting the performance of the high-speed circuit by the addition of specialized switching circuitry.

A method and system has been disclosed for testing high-speed circuitry. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for testing a high-speed circuit having a first frequency of greater than one GHz, the high-speed circuit being a high-speed phase and clock recovery circuit, the method comprising:
   obtaining a high-speed statistical signature of the high-speed circuit by oversampling an output of the high-speed circuit using a tester having a second frequency of not greater than one GHz, the tester being external to the high-speed circuit; and
   comparing the high-speed statistical signature of the high-speed circuit to an expected signature.

2. The method of claim 1 wherein obtaining the high-speed statistical signature further includes:
   utilizing the tester to provide a signal to the high-speed phase and clock recovery circuit, the signal having a delay corresponding to a phase change; and
   reading an output signal from the high-speed phase and clock recovery circuit;
   repeating the utilizing and reading steps a particular number of times.

3. The method of claim 2 wherein obtaining the high-speed statistical signature further includes:
   performing utilizing the tester to provide the signal to the high-speed phase and clock recovery circuit, the signal having the delay corresponding to the phase change, reading the output signal from the high-speed phase and clock recovery circuit and repeating steps again for at least a second delay.

4. The method of claim 2 wherein utilizing the tester to provide the signal to the high-speed phase and clock recovery circuit further includes:
   setting the delay using the tester.

5. The method of claim 2 wherein the high-speed phase and clock recovery circuit includes an internal data recovery phase setting, and wherein utilizing the tester to provide the signal to the high-speed phase and clock recovery circuit, the signal having the delay corresponding to the phase change further includes:
   determining the delay using the internal data recovery phase setting.

6. The method of claim 2 wherein the high-speed phase and clock recovery circuit further includes at least one latch and wherein reading the output signal from the high-speed phase and clock recovery circuit further includes:
   reading sampled data from at least one oversampled latch.

7. The method of claim 2 wherein the high-speed phase and clock recovery circuit further includes a parallel bus and wherein reading the output signal from the high-speed phase and clock recovery circuit further includes:
   reading sampled data from the parallel bus.

8. The method of claim 1 wherein the high-speed circuit is a high-speed phase and clock recovery circuit and wherein obtaining the high-speed statistical signature further includes:
   utilizing the tester to provide a signal to the high-speed phase and clock recovery circuit, the signal having a delay corresponding to a phase change;
   reading an output signal from the high-speed phase and clock recovery circuit;
   providing at least one new delay; and
   repeating utilizing the tester to provide the signal to the high-speed phase and clock recovery circuit, the signal having the delay corresponding to the phase change and reading the output signal from the high-speed phase and clock recovery circuit for the at least one new delay.

9. The method of claim 8 further comprising:
   repeating utilizing the tester to provide the signal to the high-speed phase and clock recovery circuit, the signal having the delay corresponding to the phase change, reading the output signal from the high-speed phase and clock recovery circuit, and providing at least one new delay a particular number of times.

10. The method of claim 1 wherein comparing the high-speed statistical signature of the high-speed circuit to the expected signature further includes:
    subtracting the high-speed statistical signature from the expected signature to obtain a difference between the high-speed statistical signature and the expected signature.

11. The method of claim 10 further comprising:
    determining whether the high-speed circuit passes the test based upon the difference being less than a particular amount at least one selected portion of the high-speed statistical signature.

12. The method of claim 11 further comprising:
    repeating obtaining the high-speed statistical signature of the high-speed circuit using the tester having the second frequency of not greater than one GHz, the tester being external to the high-speed circuit and comparing the high-speed statistical signature of the high-speed circuit to the expected signature for at least one additional setting of the high-speed circuit.

13. A method for testing a high-speed circuit having a first frequency of greater than one GHz, the method comprising:
    obtaining a high-speed statistical signature of the high-speed circuit using a tester having a second frequency of not greater than one GHz by oversampling an output of the high-speed circuit, the tester being external to the high-speed circuit;
    utilizing the tester to provide a signal to the high-speed phase and clock recovery circuit, the signal having a delay corresponding to a phase change, the tester having a second frequency of not greater than one GHz; and
    reading an output signal from the high-speed phase and clock recovery circuit;
    repeating utilizing the tester to provide the signal to the high-speed phase and clock recovery circuit and reading the output signal from the high-speed phase and clock recovery circuit a particular number of times;
    performing utilizing a tester to provide a signal to the high-speed phase and clock recovery circuit reading the output signal from the high-speed phase and clock recovery circuit for at least a second delay;
    comparing the high-speed statistical signature of the high-speed phase and clock recovery circuit to an expected signature to determine whether the high-speed phase recover circuit operates as desired; and
    optionally repeating the high-speed statistical signature obtaining and comparing the high-speed statistical signature of the high-speed phase and clock recovery circuit to an expected signature to determine whether the high-speed phase recover circuit operates as desired for at least one additional setting of the high-speed circuit.

14. The method of claim 13 wherein comparing the high-speed statistical signature of the high-speed phase and clock recovery circuit to the expected signature to determine whether the high-speed phase recover circuit operates as desired further includes:

subtracting the high-speed statistical signature from the expected signature to obtain a difference between the high-speed statistical signature and the expected signature.

* * * * *